US010201071B1

(12) United States Patent
Lin

(10) Patent No.: US 10,201,071 B1
(45) Date of Patent: Feb. 5, 2019

(54) POWER SUPPLY WITH THERMAL INSULATION FUNCTION

(71) Applicant: Chicony Power Technology Co., Ltd., New Taipei (TW)

(72) Inventor: Yu-Jan Lin, New Taipei (TW)

(73) Assignee: CHICONY POWER TECHNOLOGY CO., LTD., New Taipei (TW)

( * ) Notice: Subject to any disclaimer, the term of this patent is extended or adjusted under 35 U.S.C. 154(b) by 0 days.

(21) Appl. No.: 15/815,697

(22) Filed: Nov. 16, 2017

(30) Foreign Application Priority Data

Sep. 25, 2017 (TW) .............................. 106132753 A

(51) Int. Cl.
*H05K 1/02* (2006.01)
*H01R 12/00* (2006.01)

(52) U.S. Cl.
CPC ........... *H05K 1/0209* (2013.01); *H01R 9/091* (2013.01)

(58) Field of Classification Search
CPC .. H05K 1/0201–1/0204; H05K 1/0209; H05K 5/0047–5/006; H05K 5/0247; H05K 5/03; H05K 7/209; H05K 7/1432; H05K 1/0256; H05K 1/165; H05K 2201/09036; H05K 2201/09163; H05K 2201/09972; H05K 7/20445; H05K 7/20518; H05K 7/1401; H05K 2201/066; H01R 9/091; H01R 9/223; H01R 13/506; H01R 24/68; H01R 2103/00; H01R 13/502; H01R 12/7088; H01R 13/26; H01R 13/642; H01R 2201/06; H01R 13/5045; H01R 13/516; H01R 31/06; H01L 23/02; H02M 7/04

USPC .......... 361/679.54, 719, 720, 758, 752, 796, 361/707, 709, 714, 722; 165/80.3; 174/17.08, 547–549; 257/717–722, 713; 439/731, 465, 687

See application file for complete search history.

(56) References Cited

U.S. PATENT DOCUMENTS

| 8,162,682 | B1* | 4/2012 | Wu ..................... | H01R 31/065 |
| | | | | 439/131 |
| 9,825,415 | B1* | 11/2017 | Lin ....................... | H01R 31/06 |
| 2011/0034071 | A1* | 2/2011 | Lee ..................... | H01R 13/652 |
| | | | | 439/574 |
| 2014/0140010 | A1* | 5/2014 | Chan ..................... | H05K 7/209 |
| | | | | 361/714 |
| 2015/0131354 | A1* | 5/2015 | Nakajima ............. | H02M 7/003 |
| | | | | 363/144 |

(Continued)

*Primary Examiner* — Dion Ferguson
*Assistant Examiner* — Amir A Jalali
(74) *Attorney, Agent, or Firm* — Chun-Ming Shih; HDLS IPR Services

(57) ABSTRACT

A power supply with a thermal insulation function includes a casing, a circuit board, and a power connector. The casing has an opening and includes a first casing member and a second casing member, and the first casing member has a hollow insulation structure. The circuit board is installed in the casing and retained on the second casing member. The power connector is coupled to the circuit board and configured to be facing the opening. When the first and second casing members are engaged into the casing, the hollow insulation structure divides the area of a surface of the circuit board facing the first casing member into a first insulation space and a second insulation space, and the power connector is disposed in the first insulation space, and the hollow insulation structure is separated with an interval apart from the second insulation space for accommodating air.

9 Claims, 7 Drawing Sheets

(56) References Cited

U.S. PATENT DOCUMENTS

| | | | | |
|---|---|---|---|---|
| 2015/0331087 A1* | 11/2015 | Philipp | ................ | H05K 5/0069 |
| | | | | 342/175 |
| 2016/0021789 A1* | 1/2016 | Negishi | ............... | H01L 23/3675 |
| | | | | 361/714 |
| 2016/0066458 A1* | 3/2016 | Hirose | ................... | H05K 5/006 |
| | | | | 361/752 |
| 2017/0155237 A1* | 6/2017 | Kobayashi | .......... | B60R 16/0239 |

* cited by examiner

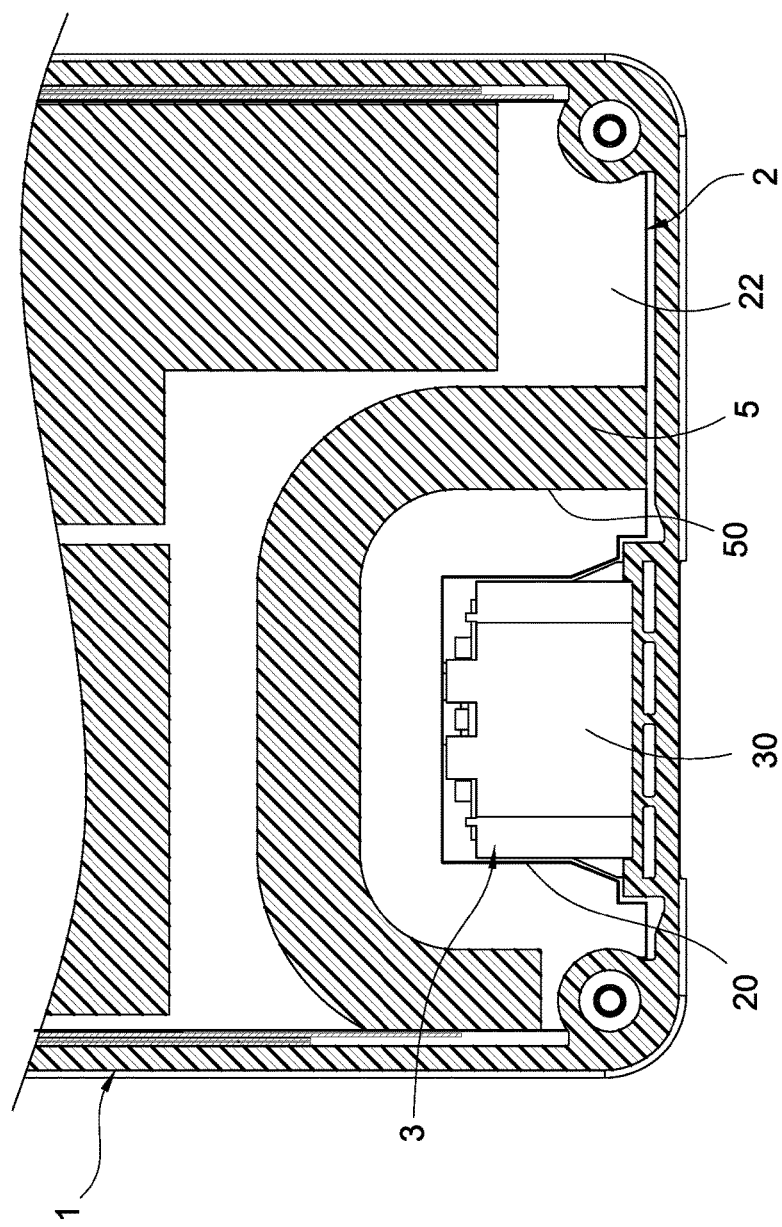

POWER SUPPLY WITH THERMAL INSULATION FUNCTION

FIELD OF THE INVENTION

This disclosure relates to a power adapter, and more particularly to a power supply with a thermal insulation function.

BACKGROUND OF THE INVENTION

As the technology of electronic products advances, the electric power required by most power supplies for an operation of a long time becomes higher and higher to meet different user requirements. Higher electrical power incurs higher wattage consumption, so that a large amount of heat is generated and the temperature of the power supply is increased. In addition, most electronic products usually come with a small and compact design but the wattage is not decreased accordingly, and the heat dissipation area is insufficient, so that the temperature of the internal components becomes too high and indirectly increases the level of difficulty of meeting the safety requirement of the cooling temperature of a power connector (or AC Inlet).

In a conventional power supply, a shielding portion at the area under the power connector is removed to isolate the heat generating components at the rear of the power connector, so as to prevent the heat from being conducted from an aluminum plate to the lower area of a plate under the power connector, but the thermal insulation effect is very limited. In addition, even if mylar is placed at the rear of the power connector to insulate the high temperature of the heat generating components, a good thermal insulation effect cannot be achieved. Such conventional power supply still has difficulties to pass the test as set specified by safety regulations, and this conventional power supply has a higher of level of difficulty to assemble the power supply.

In view of the aforementioned drawbacks of the prior art, the discloser of this disclosure based on years of experience to conduct extensive research and experiment, and finally provided a feasible solution to overcome the drawbacks of the prior art.

SUMMARY OF THE INVENTION

Therefore, it is a primary objective of this disclosure to provide a power supply with a thermal insulation function to improve the thermal insulation effect, so as to prevent the high temperature generated by the internal components of the power supply from affecting the power connector, and make it easier to pass the test as specified by the safety regulations and facilitate the assembling of the power supply.

To achieve the aforementioned and other objectives, this disclosure provides a power supply with a thermal insulation function, comprising a casing, a circuit board, and a power connector, characterized in that the casing has an opening communicating with the interior and the exterior of the casing, and the casing includes a first casing member and a second casing member, and the first casing member has a hollow insulation structure disposed thereon and formed by a plurality of ribs; the circuit board is installed in the casing and retained on the second casing member; and the power connector is coupled to the circuit board and configured to be facing the opening; wherein the first casing member has a first connecting portion, and the second casing member has a second connecting portion, and when the first and second casing members are engaged to form the casing by the corresponding configuration of the first and second connecting portions, the hollow insulation structure divides the area of a surface of the circuit board facing the first casing member into a first insulation space and a second insulation space, and the power connector is disposed in the first insulation space, and the hollow insulation structure is separated with an interval apart from the second insulation space for accommodating air.

BRIEF DESCRIPTION OF THE DRAWINGS

FIG. 7 is a partial cross-sectional view of another surface of a circuit board in accordance with the second preferred embodiment of this disclosure.

DESCRIPTION OF THE PREFERRED EMBODIMENTS

The technical contents of this disclosure will become apparent with the detailed description of preferred embodiments accompanied with the illustration of related drawings as follows. It is intended that the embodiments and figures disclosed herein are to be considered illustrative rather than restrictive.

Figure 1:
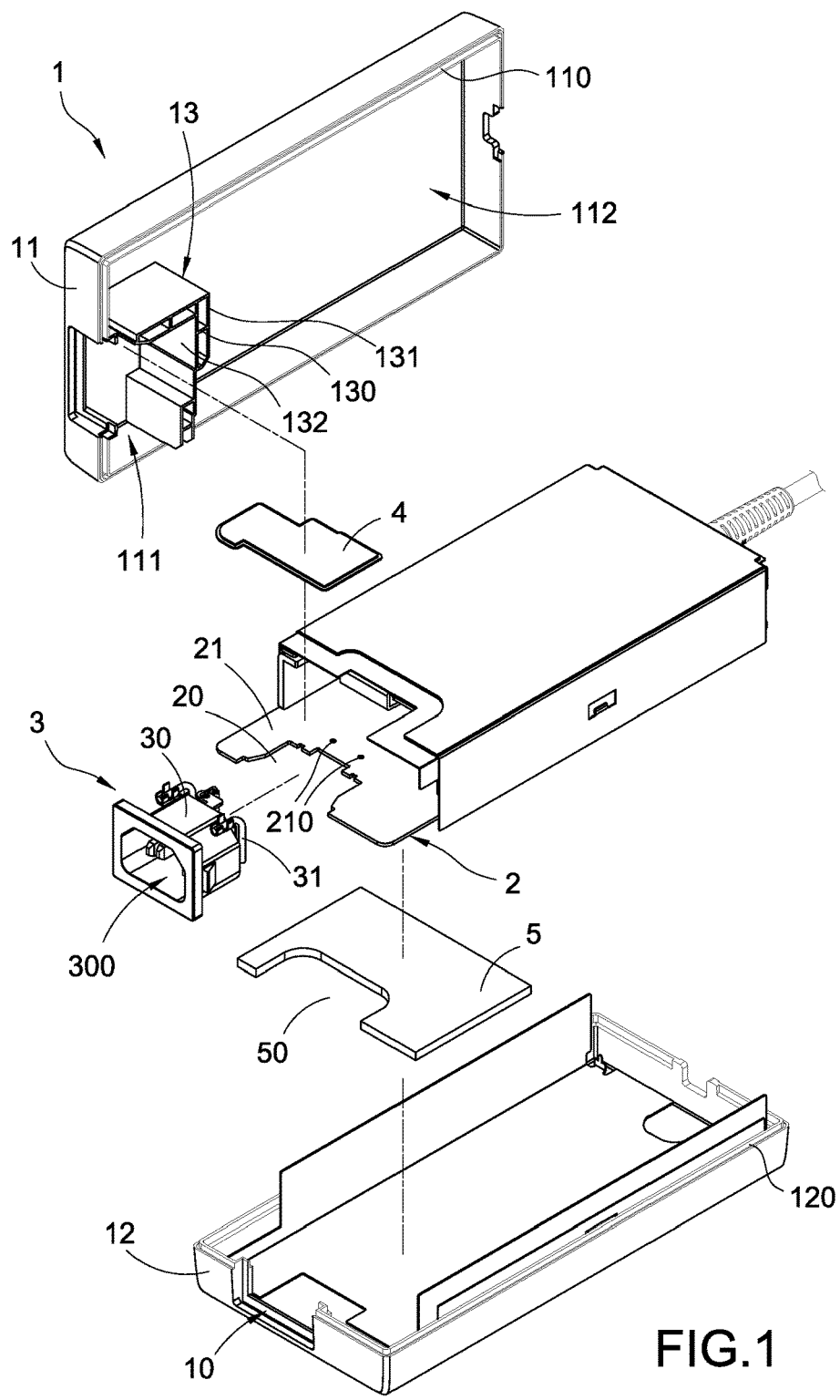
FIG. 1 is an exploded view of a first preferred embodiment of this disclosure.
Figure 2:
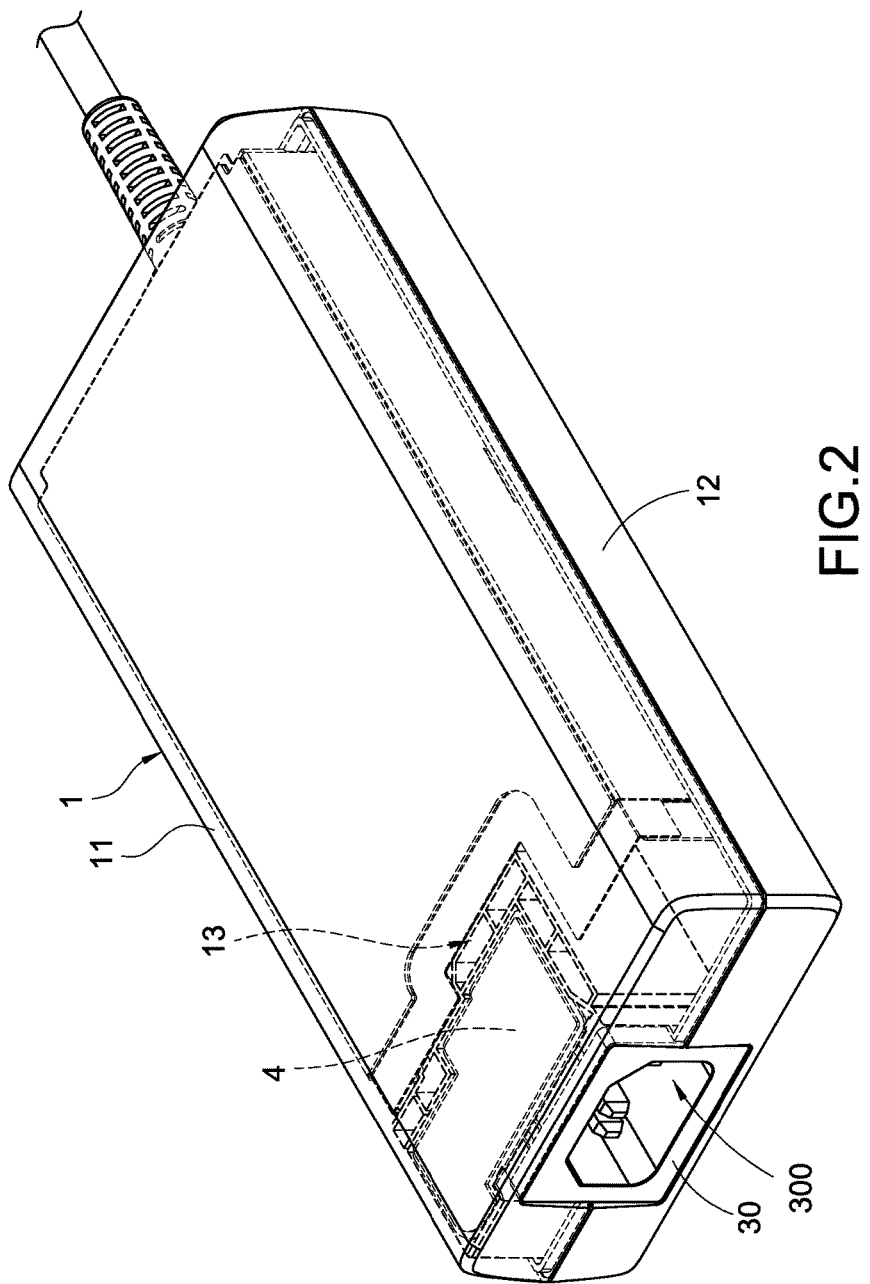
FIG. 2 is a perspective view of the first preferred embodiment of this disclosure.

With reference to FIGS. 1 and 2 for an exploded view and a perspective view of a power supply with a thermal insulation function in accordance with the first preferred embodiment of this disclosure respectively, the power supply with a thermal insulation function comprises a casing 1, a circuit board 2, and a power connector 3.

The casing 1 is hollow for containing components such as the circuit board 2 and the power connector 3. The casing 1 has an opening 10 communicating with the interior and the exterior of the casing 1, and the casing 1 includes a first casing member 11 and a second casing member 12, and the first casing member 11 has a hollow insulation structure 13 formed by a plurality of ribs 130, and the hollow insulation structure 13 may be integrally formed with the first casing member 11.

The circuit board 2 is installed in the casing 1 and retained on the second casing member 12 of the casing 1. The circuit board 2 has a plurality of electronic components installed thereon and a plurality of control circuits (such as UPB circuit, etc) disposed thereon. When the power supply is operated normally, these electronic components and control circuits inevitably produce a high temperature. This disclosure mainly uses the aforementioned hollow insulation structure 13 to insulate the high temperature.

The power connector 3 may be an AC socket (or AC Inlet) coupled to the circuit board 2 and configured to be facing the opening 10 of the casing 1, so that the hollow insulation structure 13 may be used to insulate the high temperature produced by the electronic components and control circuits. In addition, the low thermal conductivity of air not just effectively insulates the high temperature of the components at the rear side only, but also simplifies the assembling procedure of the power supply without requiring the installation of unnecessary components. Further, a thermal conduction structure 4 may be attached onto the power connector 3, wherein the thermal conduction structure 4 may be a thermal conductive plate provided for dissipating the heat of the power connector 3.

Figure 3:
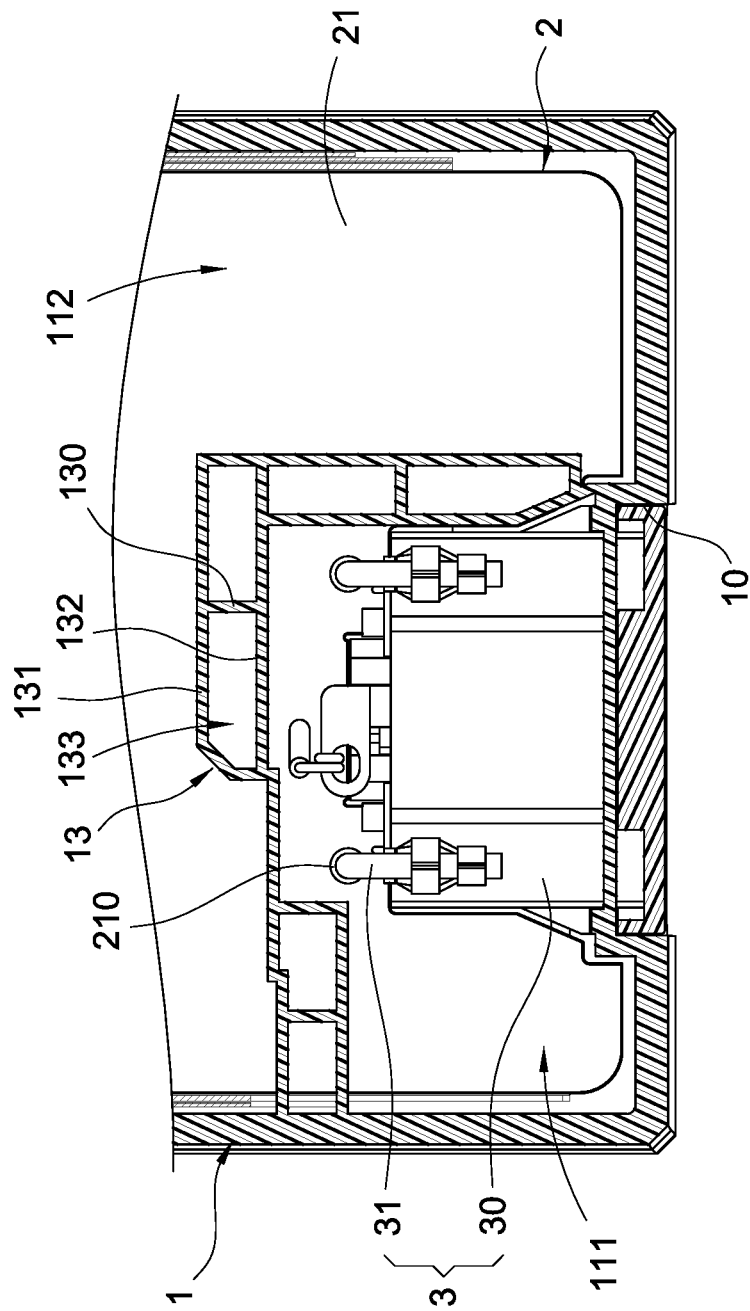
FIG. 3 is a partial cross-sectional view of a surface of a circuit board in accordance with the first preferred embodiment of this disclosure.

With reference to FIGS. 1 and 3, the hollow insulation structure 13 of the casing 1 further comprises a first partition 131 and a second partition 132 disposed apart from each other, and the first and second partitions 131, 132 may be connected continuously or connected with each other through their walls into an irregular form. The ribs 130 are connected between the first and second partitions 131, 132, so that a plurality of insulation areas 133 is formed between the first and second partitions 131, 132 for accommodating air. The ribs 130 are used to form a multi-layer structured insulation area 133 for covering the power connector 3 layer by layer at the position near the opening 10, so as to effectively insulate the high temperature produced by the components at the rear side of the circuit board 2 and prevent such high temperature from affecting the power connector 3.

Figure 4:
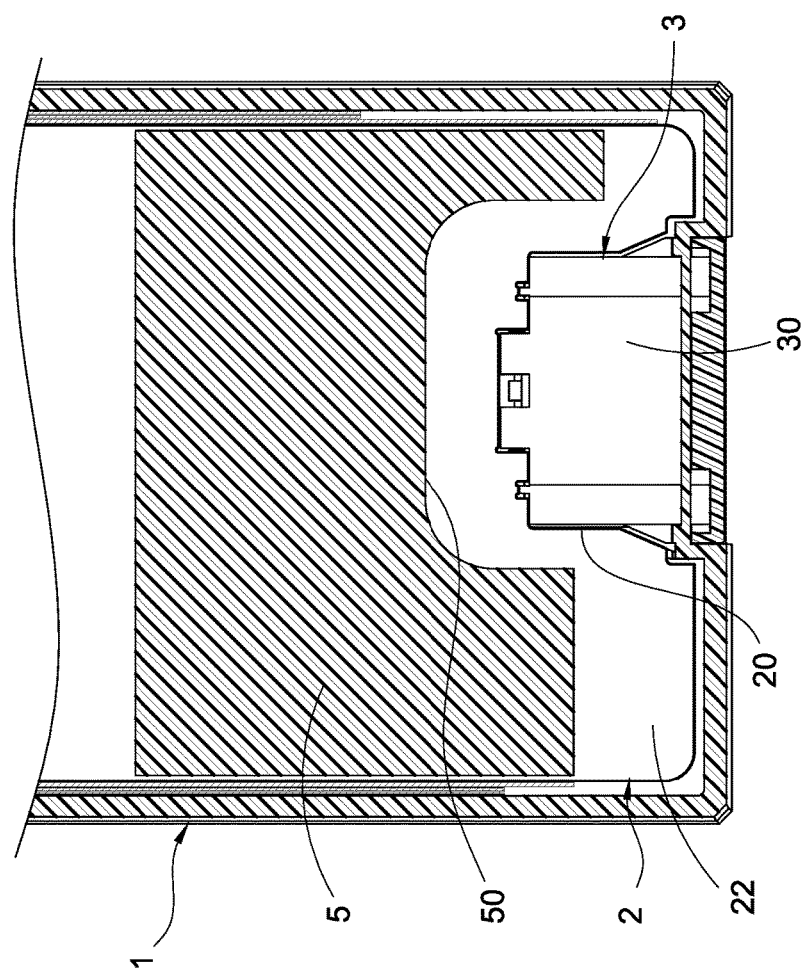
FIG. 4 is a partial cross-sectional view of another surface of a circuit board in accordance with the first preferred embodiment of this disclosure.

In FIGS. 1, 3 and 4, the circuit board 2 has a notch 20 configured to be corresponsive to the lower portion of the power connector 3, and the circuit board 2 has a surface 21 (as shown in FIG. 3) and another surface 22 (as shown in FIG. 4). In FIG. 3, the power connector 3 is disposed on the surface 21 of the circuit board 2, and the circuit board 2 has at least one electrical conduction portion 210 coupled to the power connector 3, and the electrical conduction portion 210 is disposed between the hollow insulation structure 13 and the power connector 3. In FIG. 4, the other surface 22 of the circuit board 2 has a heat transfer structure 5 disposed around the notch 20, wherein the heat transfer structure 5 is made of a thermally conducting silicone. In this preferred embodiment, the heat transfer structure 5 has a recession 50 matched with the notch 20, and the area occupied by the recession 50 may further effectively insulate and prevent the hot air under the circuit board 2 from being transmitted to the lower portion of the power connector 3 via convection, and expedite dissipating the heat of the circuit board 2 to the outside of the casing 1.

In FIGS. 1 and 3, the power connector 3 has a connecting body 30, and at least one electrically conducting terminal 31 coupled to the circuit board 2, and the front end of the connecting body 30 has a socket 300 for engaging the insertion of a plug (not shown in the figure) to define an electrical connection, and the electrically conducting terminal 31 is extended from the rear end of the connecting body 30 and coupled to the electrical conduction portion 210 of the circuit board 2, so that the power connector 3 can be conducted with the power supply through the circuit board 2.

Figure 5:
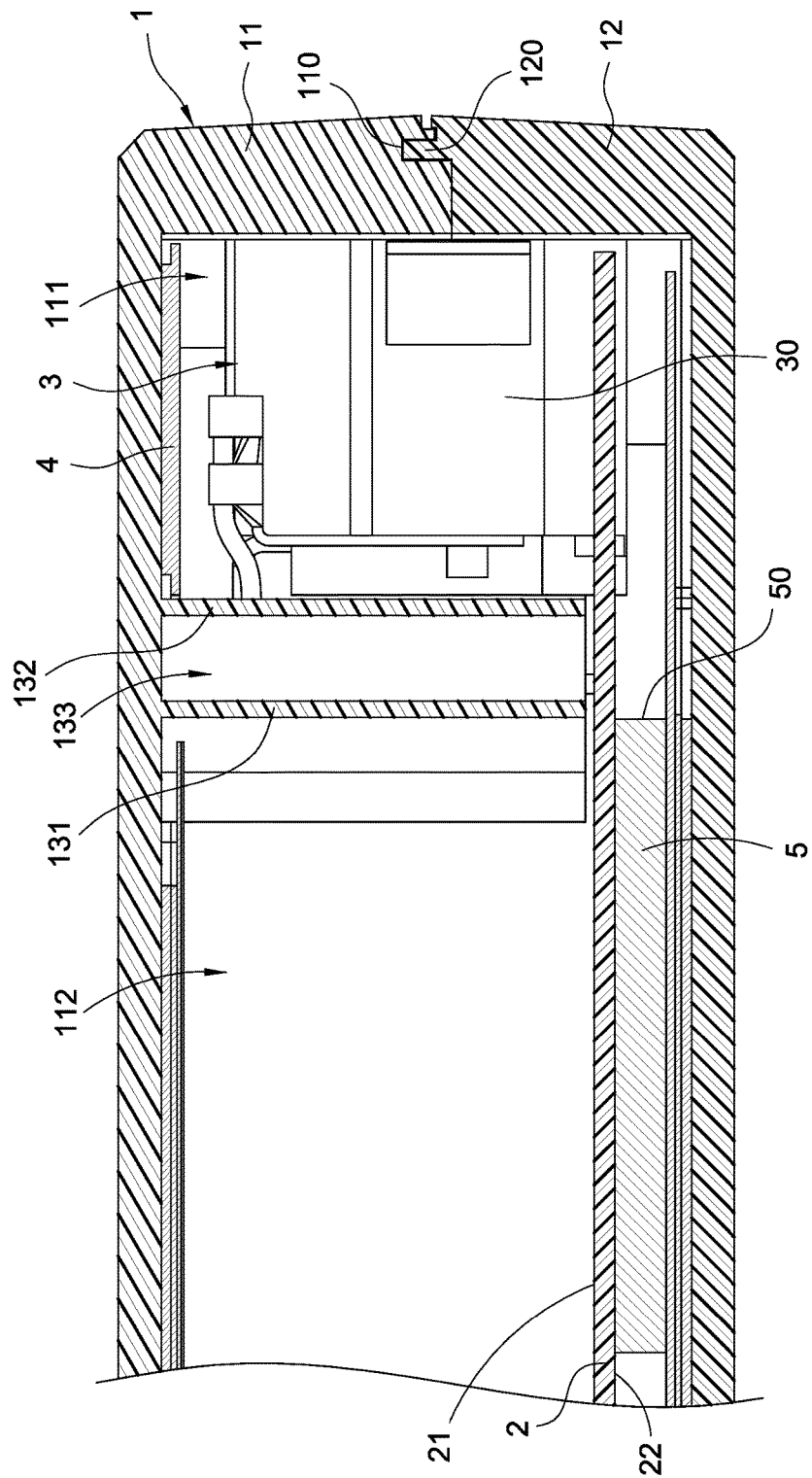
FIG. 5 is a partial cross-sectional view of the internal structure of the first preferred embodiment of this disclosure.

In FIG. 5, the first casing member 11 and the second casing member 12 of the casing 1 are configured to be corresponsive to each other, and the first casing member 11 has a first connecting portion 110, and the second casing member 12 has a second connecting portion 120, wherein the first and second connecting portions 110, 120 may be latched, locked, or adhered with each other to form the casing 1. When the first and second casing members 11, 12 are engaged to form the casing through the configuration of the first and second connecting portions 110, 120, the hollow insulation structure 13 divides an area of the surface 21 of the circuit board 2 facing the interior of the first casing member 11 into a first insulation space 111 and a second insulation space 112, and the power connector 3 is disposed in the first insulation space 111, and air is accommodated by the gap formed by the ribs 130 of the hollow insulation structure 13, so that the first insulation space 111 and the second insulation space 112 are separated with each other, and the hollow insulation structure 13 plus the low thermal conductivity of the air accommodated between the first insulation space 111 and the second insulation space 112 can effectively insulate the high temperature of the components at the rear side to achieve the effects of meeting the requirements of the safety regulations and simplifying the assembling procedure without requiring the installation of unnecessary components.

This disclosure further uses the thermal conduction structure 4 to assist the heat dissipation of the power connector 3, wherein the thermal conduction structure 4 is also disposed in the first insulation space 111, and thus the thermal conduction structure 4 can effectively dissipates the heat of the power connector 3, and the thermal conduction structure 4 is attached near an inner wall of the first casing member 11, so that extra heat can be conducted to the casing quickly to assist cooling the power connector 3 and achieve the cooling effect. In addition, this disclosure further uses the heat transfer structure 5 to prevent the high temperature from being transmitted from the lower portion of the circuit board 2 to the power connector 3, wherein the heat transfer structure 5 is operated together with the hollow insulation structure 13 to effectively insulate the hot air produced by the components under the circuit board 2 to the lower portion of the power connector 3, so as to prevent the power connector 3 from being affected by the high temperature or preventing the power connector 3 from exceeding the temperature limitation as specified by the safety regulations.

In FIG. 3, the circuit board 2, the electrical conduction portion 210 coupled to the power connector 3, and the electrically conducting terminal 31 of the power connector 3 for coupling the circuit board 2 are disposed in the first insulation space 111. Therefore, the issue of transmitting high temperature by the power connector 3 no longer exists, even though it is necessary to connect the circuit board 2 and the connection is near the components at the rear side of the circuit board 2. Under the insulation provided by the hollow insulation structure 13 and the air accommodated therein, the power connector 3 can be coupled to the circuit board 2 at unaffected temperature.

Figure 6:
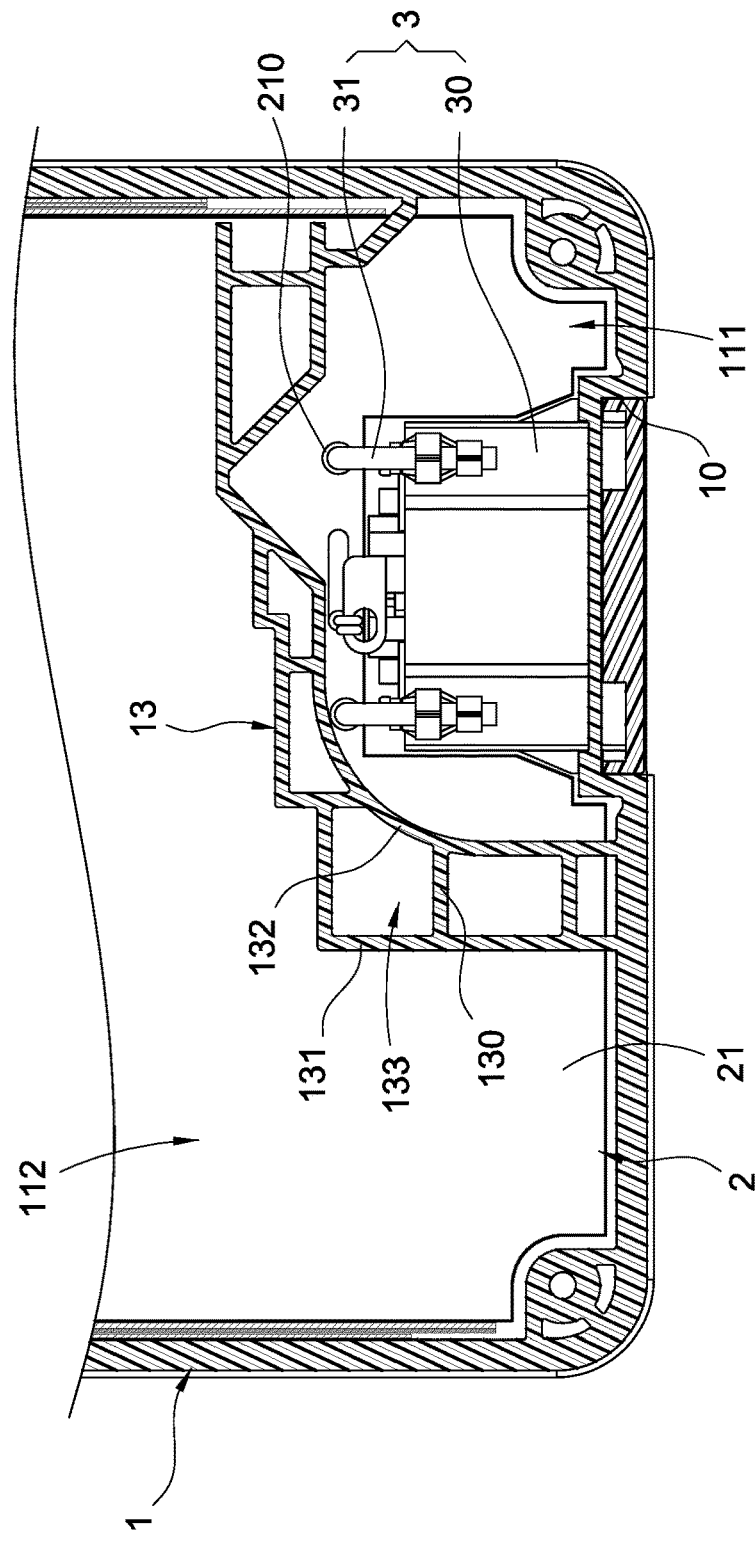
FIG. 6 is a partial cross-sectional view of a surface of a circuit board in accordance with a second preferred embodiment of this disclosure.

With reference to FIGS. 6 and 7 for another preferred embodiment of this disclosure, the hollow insulation structure 13 may have various irregular forms by using ribs 130 of different lengths and the first and second partitions 131, 132 of different shapes to achieve the same effect. In addition, the heat transfer structure 5 may be configured to be corresponsive to the notched 20 and disposed around the notch 20 to form the recession 50 to achieve the same effect.

The power supply with a thermal insulation function in accordance with this disclosure is formed by the aforementioned components.

In the power supply with a thermal insulation function of this disclosure, the hollow insulation structure 13 is designed on the casing of the power supply casing, and the interior of the casing of the power supply is separated and divided into different air chambers. Such arrangement not just blocks the transmission of most of the heat generated by the heat generating components of the circuit board only, but also reduces the heat transmission by the low thermal conductivity of the air. With the configuration of the hollow insulation structure 13, the thermal conduction structure 4 and the heat transfer structure 5 can be used to further assist the power connector 3 to lower its temperature and dissipate its heat. In addition, such arrangement can prevent the convection of hot air under the circuit board 2, so as to overcome the issues of having a too-high temperature of the power connector and failing to comply with the safety regulations of this disclosure.

While this disclosure has been described by means of specific embodiments, numerous modifications and variations could be made thereto by those skilled in the art without departing from the scope and spirit of this disclosure set forth in the claims.

What is claimed is:

1. A power supply with a thermal insulation function, comprising:
   a casing, having an opening communicating with the interior and the exterior of the casing, and the casing including a first casing member and a second casing member, and the first casing member having a hollow insulation structure disposed thereon and formed by a plurality of ribs;
   a circuit board, installed in the casing, and retained on the second casing member; and
   a power connector, coupled to the circuit board and configured to be facing the opening;
   wherein the first casing member has a first connecting portion, and the second casing member has a second connecting portion, and when the first and second casing members are engaged to form the casing by the corresponding configuration of the first and second connecting portions, the hollow insulation structure divides an area of a surface of the circuit board facing the first casing member into a first insulation space and a second insulation space, and the power connector is disposed in the first insulation space, and the hollow insulation structure is separated with an interval apart from the second insulation space for accommodating air;
   wherein the circuit board has a notch configured to be corresponsive to a lower portion of the power connector, and the other surface of the circuit board has a heat transfer structure disposed around the notch.

2. The power supply with a thermal insulation function according to claim 1, wherein the first and second connecting portions are latched, locked or adhered with each other to form the casing.

3. The power supply with a thermal insulation function according to claim 1, wherein the first insulation space contains a thermal conduction structure attached proximate to an inner wall of the first casing member and onto the power connector.

4. The power supply with a thermal insulation function according to claim 3, wherein the thermal conduction structure is a thermal conducting plate.

5. The power supply with a thermal insulation function according to claim 1, wherein the hollow insulation structure and the first casing member are integrally formed.

6. The power supply with a thermal insulation function according to claim 1, wherein the hollow insulation structure further has a first partition and a second partition disposed with an interval apart from each other, and the ribs are coupled between the first and second partitions to form a plurality of insulation areas for containing air between the first and second partitions.

7. The power supply with a thermal insulation function according to claim 1, wherein the heat transfer structure is made of a thermally conducting silicone.

8. The power supply with a thermal insulation function according to claim 1, wherein the circuit board has at least one electrical conduction portion coupled to the power connector and disposed in the first insulation space.

9. The power supply with a thermal insulation function according to claim 1, wherein the power connector has a connecting body, and at least one electrically conducting terminal coupled to the circuit board and extended from the connecting body to couple with the circuit board, and both of the connecting body and the electrically conducting terminal are disposed in the first insulation space.

* * * * *